(12) United States Patent
Kang

(10) Patent No.: US 10,032,696 B2
(45) Date of Patent: Jul. 24, 2018

(54) CHIP PACKAGE USING INTERPOSER SUBSTRATE WITH THROUGH-SILICON VIAS

(71) Applicant: NVIDIA Corporation, Santa Clara, CA (US)

(72) Inventor: Teckgyu Kang, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/725,538

(22) Filed: Dec. 21, 2012

(65) Prior Publication Data

US 2014/0175665 A1 Jun. 26, 2014

(51) Int. Cl.
| | |
|---|---|
| H01L 23/48 | (2006.01) |
| H01L 23/14 | (2006.01) |
| H01L 23/498 | (2006.01) |
| H01L 21/48 | (2006.01) |
| H01L 23/538 | (2006.01) |
| H01L 25/065 | (2006.01) |
| H01L 23/36 | (2006.01) |
| H01L 23/64 | (2006.01) |

(52) U.S. Cl.
CPC .......... *H01L 23/481* (2013.01); *H01L 21/486* (2013.01); *H01L 23/147* (2013.01); *H01L 23/49833* (2013.01); *H01L 23/5384* (2013.01); *H01L 25/0655* (2013.01); *H01L 23/36* (2013.01); *H01L 23/64* (2013.01); *H01L 2224/16225* (2013.01); *H01L 2224/32225* (2013.01); *H01L 2224/73204* (2013.01); *H01L 2924/15311* (2013.01)

(58) Field of Classification Search
CPC ................. H01L 29/0847; H01L 51/56; H01L 2251/5338; H01L 29/7827; C09K 11/06
USPC .......................................................... 257/774
See application file for complete search history.

(56) References Cited

U.S. PATENT DOCUMENTS

2011/0291288 A1* 12/2011 Wu et al. ........................ 257/774
2013/0087920 A1* 4/2013 Jeng et al. ..................... 257/773

FOREIGN PATENT DOCUMENTS

| CN | 202394959 U | 8/2012 |
|---|---|---|
| TW | 201135879 A | 10/2011 |
| TW | 201225762 A | 6/2012 |

* cited by examiner

*Primary Examiner* — Andy Huynh
(74) *Attorney, Agent, or Firm* — Artegis Law Group, LLP

(57) ABSTRACT

A microelectronic package includes an interposer with through-silicon vias that is formed from a semiconductor substrate and one or more semiconductor dies coupled to the interposer. A first signal redistribution layer formed on the first side of the interposer electrically couples the one or more semiconductor dies to the through-silicon vias. A second redistribution layer is formed on a second side of the interposer, and is electrically coupled to the through-silicon vias. In some embodiments, a mold compound is connected to an edge surface of the interposer and is configured to stiffen the microelectronic package.

13 Claims, 7 Drawing Sheets

US 10,032,696 B2

CHIP PACKAGE USING INTERPOSER SUBSTRATE WITH THROUGH-SILICON VIAS

BACKGROUND OF THE INVENTION

Field of the Invention

Embodiments of the present invention relate generally to integrated circuit chip packaging and, more specifically, to a chip package using an interposer substrate with through-silicon vias.

Description of the Related Art

In the packaging of integrated circuit (IC) chips, it is generally desirable to minimize the size and thickness of the packaging assembly, or "chip package," in which an IC chip is encased. In mobile computing devices, such as smart phones, laptop computers, electronic tablets, and the like, it is particularly desirable to minimize the thickness of IC packages, so that such mobile devices can be further reduced in size and weight. For example, rather than being mounted on a conventional packaging substrate, which has a thickness on the order of one or more millimeters, IC chips can be mounted on an interposer substrate, which may be as thin as 100 microns.

However, interposer substrates are prone to significant warpage when used as part of a chip package, particularly during the reflow process. Warpage of the interposer substrate during fabrication of a chip package can reduce yield and result in poor package reliability, both of which are highly undesirable.

Accordingly, there is a need in the art for an IC package that has a reduced thickness.

SUMMARY OF THE INVENTION

One embodiment of the present invention sets forth a microelectronic package having an interposer that is formed from a semiconductor substrate and includes through-silicon vias. One or more semiconductor dies are coupled to the interposer, and a first redistribution layer formed on the first side of the interposer electrically couples the one or more semiconductor dies to the through-silicon vias. In addition, a second redistribution layer is formed on a second side of the interposer, and is electrically coupled to the through-silicon vias. In some embodiments, a mold compound is connected to an edge surface of the interposer and is configured to stiffen the microelectronic package.

One advantage of above-described embodiment is that the thickness of a microelectronic package can be significantly reduced without the danger of unwanted warpage of components in the microelectronic package. A further advantage is that the use of mold compound in lieu of an underfill material to protect electrical connections between IC chips and the interposer reduces the overall footprint of the microelectronic package. This is because the mold compound allows the placement of passive components mounted to the interposer very close to IC chips that are also mounted on the interposer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

For clarity, identical reference numbers have been used, where applicable, to designate identical elements that are common between figures. It is contemplated that features of one embodiment may be incorporated in other embodiments without further recitation.

DETAILED DESCRIPTION

Figure 1:
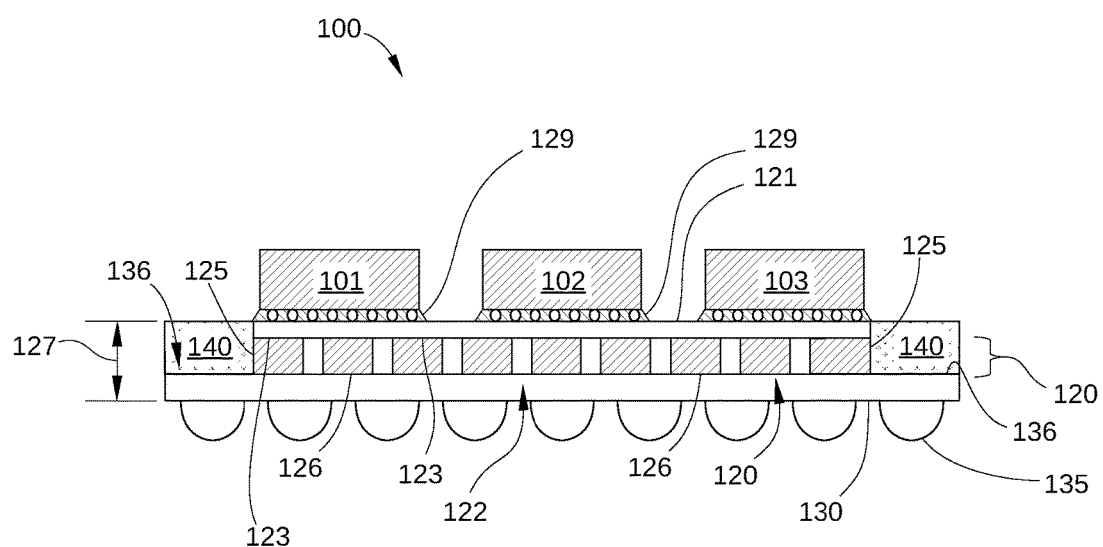
FIG. 1 is a schematic cross-sectional view of a microelectronic package, arranged according to one embodiment of the invention.

FIG. 1 is a schematic cross-sectional view of a microelectronic package 100, arranged according to one embodiment of the invention. Microelectronic package 100 includes integrated circuit (IC) chips 101, 102, and 103, an interposer 120, a packaging substrate 130, and a molded stiffener 140. Microelectronic package 100 is configured to electrically and mechanically connect the IC chips 101, 102, and 103 and any other logic or memory ICs mounted on interposer 120 to a printed circuit board or other mounting substrate (not shown) external to microelectronic package 100. In addition, microelectronic package 100 protects IC chips 101, 102, and 103 from ambient moisture and other contamination and minimizes mechanical shock and stress thereon. For clarity, some elements of IC system 100 are omitted from FIG. 2, such as any over-molding that may be used to encapsulate IC chips 101, 102, and 103, a heat spreader, etc.

Each of IC chips 101, 102, and 103 is a semiconductor chip, such as a central processing unit (CPU), a graphics processing unit (GPU), an application processor or other logic device, a memory chip, a global positioning system (GPS) chip, a radio frequency (RF) transceiver chip, a Wi-Fi chip, a system-on-chip, or any semiconductor chip that is suitable for mounting on interposer 120. Thus, IC chips 101, 102, and 103 may include any IC chips that may benefit from being assembled together in a single microelectronic package. In some embodiments, IC chip 102 is a logic chip, such as a CPU or GPU, and IC chips 101 and 103 are memory chips associated with IC chip 102. IC chips 101, 102, and 103 are mounted on interposer 120, and may be mounted to interposer substrate 130 using solder microbumps or any other technically feasible approach. An underfill material 129 may be used to protect the electrical connections between IC chips 101, 102, and 103 and interposer 120. As shown, IC chips 101, 102, and 103 are electrically coupled to each other with electrical interconnects formed in a redistribution layer (RDL) 121 on interposer 120. The electrical interconnects of RDL 121 are configured to electrically couple IC chips 101, 102, and 103 to each other and to through-silicon vias 122, which are formed in interposer 120 and are described below. RDL 121 generally includes ground, power, and signal connections to each of IC chips 101, 102, and 103, and can be formed on interposer 120 using various deposition, patterning, and etching techniques well-known in the art.

Interposer 120 comprises an intermediate layer or structure that provides electrical connections between IC chips 101, 102, and 103, any other semiconductor chips mounted on interposer 120, and packaging substrate 130. In some embodiments, interposer 120 is formed from a semiconductor substrate, such as a silicon wafer, and is therefore much thinner than a conventional packaging substrate. For example, interposer 120 can have a thickness 127 of 80 microns or less, whereas conventional packaging substrates are on the order of one or more millimeters in thickness. The electrical connections between IC chips 101, 102, and 103 and packaging substrate 130 are configured to facilitate high-speed propagation of signals between IC chips 101, 102, and 103 and packaging substrate 130. Such electrical connections include the electrical interconnects of RDL 121 and through-silicon vias 122.

RDL 121 is generally formed on surface 123 of interposer 120 using wafer-level deposition, patterning, and etching processes, i.e., these processes are performed on a complete semiconductor wafer or other substrate. In this way, RDL's for a plurality of microelectronic packages are formed simultaneously on a complete semiconductor substrate, and the semiconductor substrate is subsequently singulated into individual interposer elements, such as interposer 120, with RDL 121 already formed thereon. Through-silicon vias 122 are "micro vias" formed through interposer 120, and may be bumped with a conductive material such, as solder, for making electrical connections directly to IC chips 101, 102, and 103 and/or to the electrical interconnects of RDL 121. RDL 121 and through-silicon vias 122 effectively provide very short electrical connections between IC chips 101, 102, and 103 and to packaging substrate 130.

Packaging substrate 130 is a rigid and thermally insulating substrate on which interposer 120 is mounted and provides microelectronic package 100 with structural rigidity. In some embodiments, packaging substrate 130 is a laminate substrate and is composed of a stack of insulative layers or laminates that are built up on the top and bottom surfaces of a core layer. Packaging substrate 130 also provides an electrical interface for routing input and output signals and power between IC chips 101, 102, and 103 and electrical connections 135. Electrical connections 135 provide electrical connections between microelectronic package 100 and a printed circuit board or other mounting substrate external to microelectronic package 100. Electrical connections 135 may be any technically feasible chip package electrical connection known in the art, including a ball-grid array (BGA), a pin-grid array (PGA), and the like.

Molded stiffener 140 is connected to edge surfaces 125 of interposer 120, and comprises an injection-molded component formed from a mold compound using an injection molding process. Molded stiffener 140 is fabricated by injecting a suitable molten material, such as a molding compound, into a mold cavity or chase. The mold cavity is formed by edge surfaces 125 of interposer 120, exposed portions of surface 136 of packaging substrate 130 that are adjacent to edge surfaces 125, and a removable mold assembly (not shown in FIG. 1 for clarity). After cooling and hardening of the molding compound, and the removal of the mold assembly, the injected molding compound forms molded stiffener 140 as shown in FIG. 1. In some embodiments, the molding compound and removable mold are selected so that molded stiffener 140 not only contacts edge surfaces 125 of interposer 120, but also surface 126 of interposer 120, i.e., the surface facing packaging substrate 130. In such embodiments, the molding compound is selected to be suitable for injection into the relatively narrow gap between surface 126 of interposer 120 and surface 136 of packaging substrate 130, which can be on the order of about 80 microns.

It is noted that because molded stiffener 140 is formed on edge surfaces 125 of interposer 120, interposer 120 can have a thickness 127 that is less than 100 microns without warping during the fabrication of microelectronic package 100. This is due to the additional structural stiffness provided by molded stiffener 140.

The advantages of microelectronic package 100, in which multiple IC chips are coupled to a single interposer substrate are manifold. Because IC chips 101, 102, and 103 are each coupled to interposer 120 and communicate with each other using RDL 121, higher electrical performance can be achieved compared to a microelectronic package in which IC chips 101, 102, and 103 are each coupled to a conventional packaging substrate or printed circuit board. Furthermore, the complexity of microelectronic package 100 is reduced compared to conventional microelectronic packages that include multiple IC chips. For example, the so called package-on-package configuration involves the fabrication of multiple chip packages that are then stacked and electrically connected to each other, where each chip package may include a packaging substrate. In contrast, microelectronic package 100 includes a single packaging substrate and a very thin interposer, which is sufficiently rigid due to molded stiffener 140 contacting edge surfaces 125 and, in some embodiments, surface 126. In addition to enabling multiple IC chips to be coupled to a thin interposer without warpage, the increased stiffness provided by molded stiffener 140 enhances the reliability of microelectronic package 100.

Figure 2:
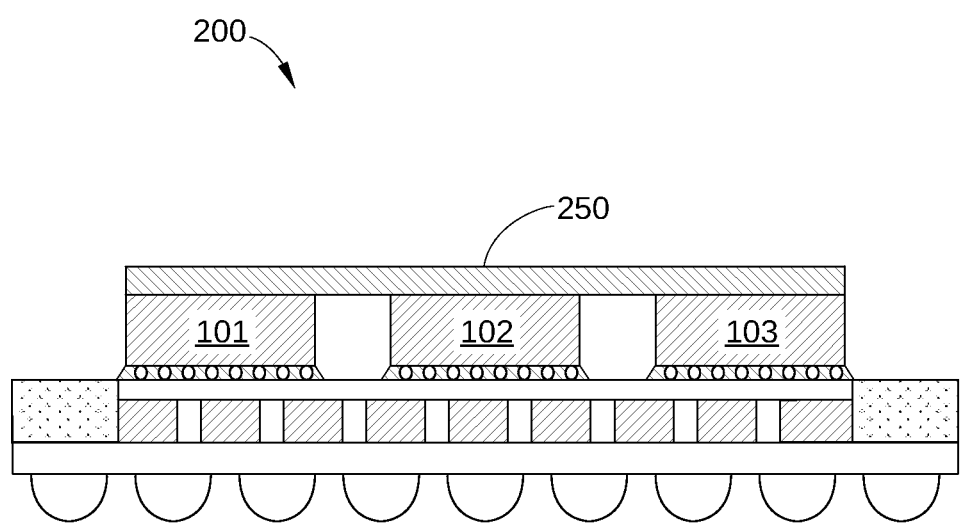
FIG. 2 is a schematic cross-sectional view of a microelectronic package, arranged according to one embodiment of the invention.

FIG. 2 is a schematic cross-sectional view of a microelectronic package 200, arranged according to one embodiment of the invention. Microelectronic package 200 is substantially similar in configuration and operation to microelectronic package 100 in FIG. 1, except that microelectronic package 200 also includes a heat spreader 250. Heat spreader 250 of microelectronic package 200 is thermally coupled to IC chips 101, 102, and 103 to enhance transmission of heat generated by IC chips 101, 102, and 103. In some embodiments, heat spreader 250 is formed from a single piece of metal having a relatively high thermal conductivity, such as a stamped copper or aluminum plate. Suitable materials for heat spreader 250 include copper, aluminum, or any other metal having a thermal conductivity that is at least equal to the thermal conductivity of aluminum, i.e., at least about 230 W m$^{-1}$ K$^{-1}$.

Figure 3:
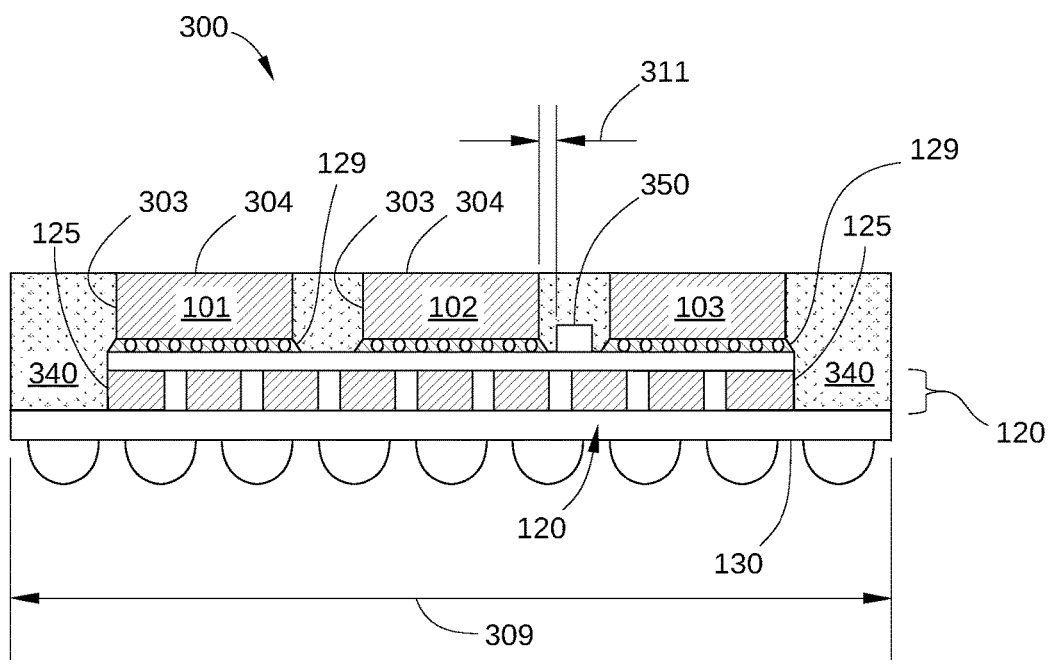
FIG. 3 is a schematic cross-sectional view of a microelectronic package, arranged according to one embodiment of the invention.

FIG. 3 is a schematic cross-sectional view of a microelectronic package 300, arranged according to one embodiment of the invention. Microelectronic package 300 is substantially similar in configuration and operation to microelectronic package 100 in FIG. 1, except that in microelectronic package 300, a molded stiffener 340 is configured to contact one or more surfaces of IC chips 101, 102, and 103, in addition to edge surfaces 125 of interposer 120. In such embodiments, molded stiffener 340 replaces underfill material 129. For reference, the location of underfill material 129 is shown in FIG. 3. In addition, molded stiffener 340 may also contact edge surfaces 303 of IC chips 101, 102, and 103. In the embodiment illustrated in FIG. 3, molded stiffener 340 is formed in contact with all of surfaces 303, only leaving top surfaces 304 of IC chips 101, 102, and 103 exposed.

The use of molding stiffener 340 in lieu of underfill 129 in microelectronic package 300 can reduce a width 309 of microelectronic package 300, thereby making microelectronic package 300 smaller, less expensive, and more reliable. This is because the use of underfill material 129 to protect the electrical connections of IC chips 101, 102, and 103 to interposer 120 requires a significant stand-off distance 311 between IC chips 101, 102, and 103 and any passive components 350 coupled to interposer 120. Such components may include decoupling capacitors, resistors, inductors, or any other passive electrical components mounted to interposer 120. Without an adequate stand-off distance 311, for example 2 to 3 mm, underfill material 129 disposed under IC chips 101, 102, and 103 may contact passive components 350, which is highly undesirable. Specifically, during the reflow process, thermal expansion of solidified underfill material 129 contacting passive components 350 can physically displace such components, resulting in significant reliability and yield issues. Because molding stiffener 340 can safely contact passive components 350 during the reflow process, stand-off distance 311 in microelectronic package 300 can be very small, for example on the order of about 0.1 mm.

In some embodiments, a microelectronic package that includes an interposer with through-silicon vias and multiple IC chips coupled thereto is formed without a packaging substrate. Instead, an electrical interface for routing input and output signals and power between IC chips in the microelectronic package and a printed circuit board are provided by a second RDL formed on a surface of the interposer. One such embodiment is illustrated in FIG. 4.

Figure 4:
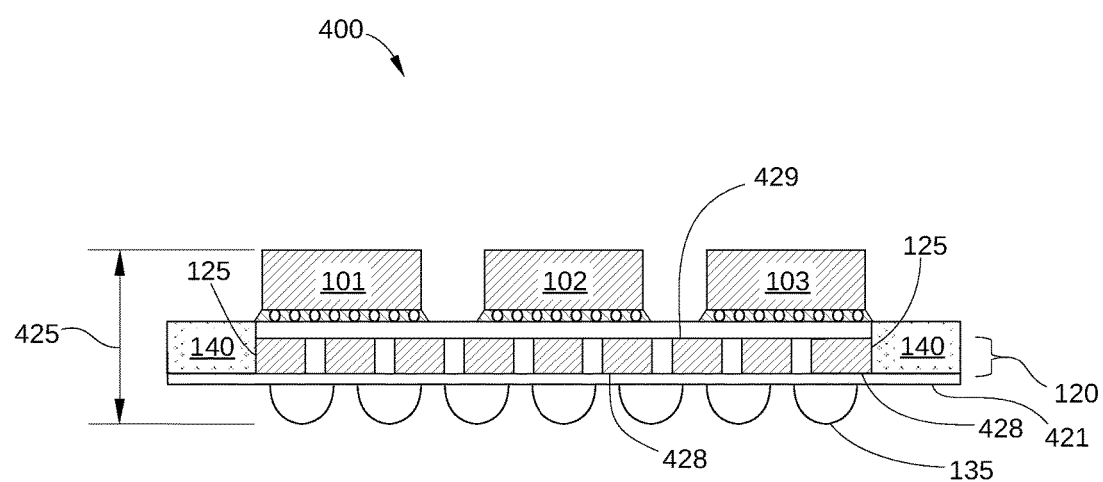
FIG. 4 is a schematic cross-sectional view of a microelectronic package, arranged according to one embodiment of the invention.

FIG. 4 is a schematic cross-sectional view of a microelectronic package 400, arranged according to one embodiment of the invention. Microelectronic package 400 is substantially similar in configuration and operation to microelectronic package 100 in FIG. 1, except that microelectronic package 400 does not include a packaging substrate, such as packaging substrate 130. Instead, a second RDL 421 is formed on an exposed surface 428 of interposer 120, as shown in FIG. 4. Second RDL 421 may be configured to be substantially similar to RDL 121, described above in conjunction with FIG. 1. The electrical interconnects included in second RDL 421 are configured to electrically couple through-silicon vias 122 in interposer 120 to electrical connections 135, which provide electrical connections between microelectronic package 400 and a printed circuit board.

Because microelectronic package 400 includes molded stiffener 140, the stiffness provided by a packaging substrate is not necessary. In this way, a thickness 425 of microelectronic package 400 can be significantly reduced with respect to conventional microelectronic packages that do include a packaging substrate. Furthermore, the fabrication process for microelectronic package 400 is simplified; not only is the process of forming a packaging substrate eliminated, in some embodiments the fabrication steps for forming second RDL 421 on interposer 120 can be performed as part of the wafer-level processes used to form RDL 121. Thus, microelectronic package 400 can be less complex and costly than microelectronic packages that include a packaging substrate.

In some embodiments of microelectronic package 400, second RDL 421 is formed using an alternative fabrication process. Rather than using a wafer-level process to form second RDL 421, a plurality of interposers 120 are singulated from an interposer substrate and mounted on a carrier frame. Molded stiffener 140 is then formed around the plurality of interposers 120 formed on the carrier frame, leaving the top surfaces (which correspond to surface 429 in FIG. 4) of the interposers 120 exposed. With the plurality of interposers 120 held in place by the hardened or cured molded stiffener 140, the carrier frame can be removed and RDL 421 formed on the surface previously in contact with the carrier frame, i.e., surface 428 of interposer 120 in FIG. 4.

Figure 5:
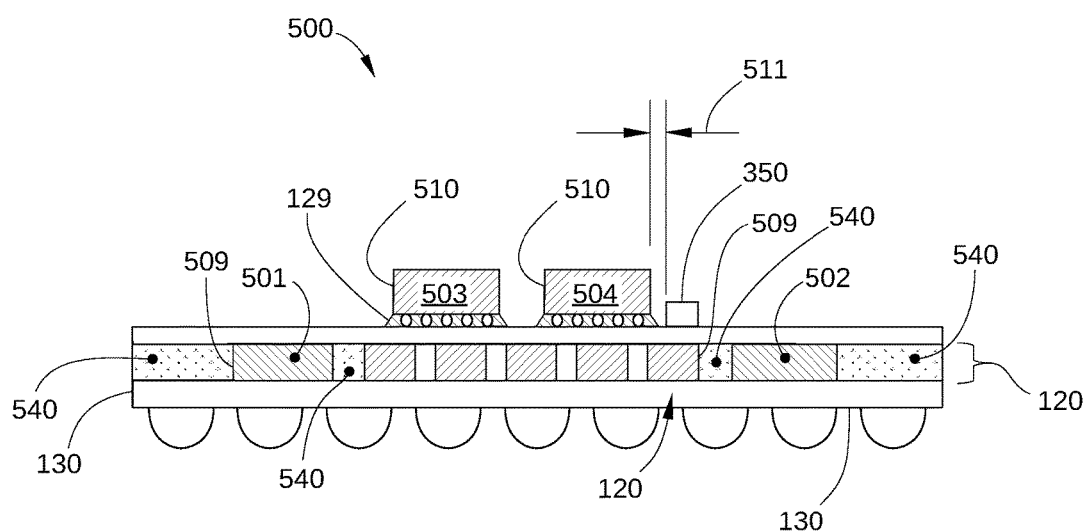
FIG. 5 is a schematic cross-sectional view of a microelectronic package, arranged according to another embodiment of the invention.

FIG. 5 is a schematic cross-sectional view of a microelectronic package 500, arranged according to another embodiment of the invention. Microelectronic package 500 includes an interposer with multiple IC chips coupled thereto that is mounted on a packaging substrate along with one or more other IC chips. Specifically, microelectronic package 500 includes interposer 120 and IC chips 501 and 502 coupled to packaging substrate 130, and IC chips 503 and 504 coupled to interposer 120 as shown. In some embodiments, IC chips 503 and 504 include IC chips that benefit significantly from the high-speed propagation of signals facilitated by connection to interposer 120. For example, IC chip 503 may be a logic chip, CPU, or GPU, and IC chip 504 may be a memory chip associated with IC chip 503.

Molded stiffener 540 is formed in contact with packaging substrate 130, edge surfaces 509 of interposer 120, and IC chips 501 and 502, as shown in FIG. 5. In other embodiments, mold stiffener 540 is also formed in contact with edge surfaces 510 of IC chips 503 and 504. In some embodiments, electrical connections of IC chips 503 and 504 are protected with underfill material 129 as shown, and in other embodiments, mold stiffener 540 is used in lieu of underfill material 129. In some embodiments, the use of mold stiffener 540 facilitates a reduced stand-off distance 511 between IC chips 501, 502, 503, and 504 and any passive components 350 coupled to interposer 120, thereby reducing the overall size of microelectronic package 500.

Figure 6:
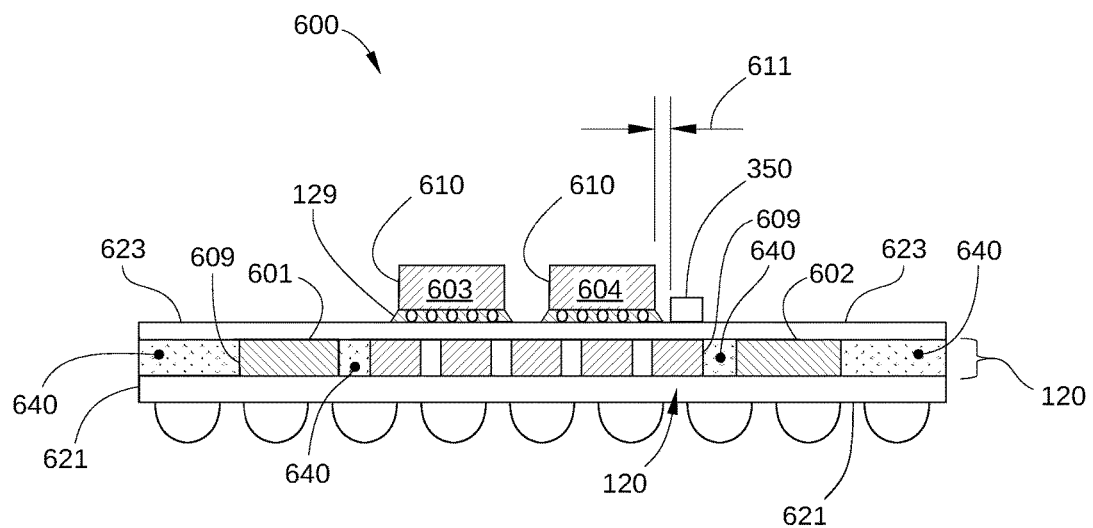
FIG. 6 is a schematic cross-sectional view of a microelectronic package, arranged according to another embodiment of the invention.

FIG. 6 is a schematic cross-sectional view of a microelectronic package 600, arranged according to another embodiment of the invention. Microelectronic package 600 includes an interposer with multiple IC chips coupled thereto that is electrically connected to a second RDL along with one or more other IC chips. Specifically, microelectronic package 600 includes interposer 120 and IC chips 601 and 602 electrically connected to second RDL 621 and IC chips 603 and 604 coupled to interposer 120 as shown. Thus, the second RDL 621 is used in lieu of a packaging substrate, such as packaging substrate 130 in FIG. 5, to electrically connect microelectronic package 600 to a printed circuit board. Second RDL 621 is formed on one side of interposer 120 and RDL 623, which electrically connects IC chips 603 and 604, is formed on an opposite to the side of interposer 120.

Molded stiffener 640 is formed in contact with edge surfaces 609 of interposer 120, and IC chips 601 and 602, as shown in FIG. 6. In other embodiments, mold stiffener 640 is also formed in contact with edge surfaces 610 of IC chips 603 and 604. In some embodiments, electrical connections of IC chips 603 and 604 are protected with underfill material 129 as shown, and in other embodiments, mold stiffener 640 is used in lieu of underfill material 129. Second RDL 621 and mold stiffener 640 are formed in substantially the same fashion that second RDL 521 and mold stiffener 540 are formed, as described above in conjunction with FIG. 5.

Microelectronic package 600 has an advantageously reduced thickness compared to multi-chip packages that include one or more conventional packaging substrates. In addition, microelectronic package 600 facilitates high-speed propagation of signals between IC chips 603 and 604, since IC chips 603 and 604 are disposed on interposer 120 and are electrically connected with RDL 121. Furthermore, the use of mold stiffener 640 allows a reduced stand-off distance 611 between IC chips 601, 602, 603, and 604 and any passive components 350 coupled to interposer 120, which advantageously reduces the overall size of microelectronic package 600.

Figure 7:
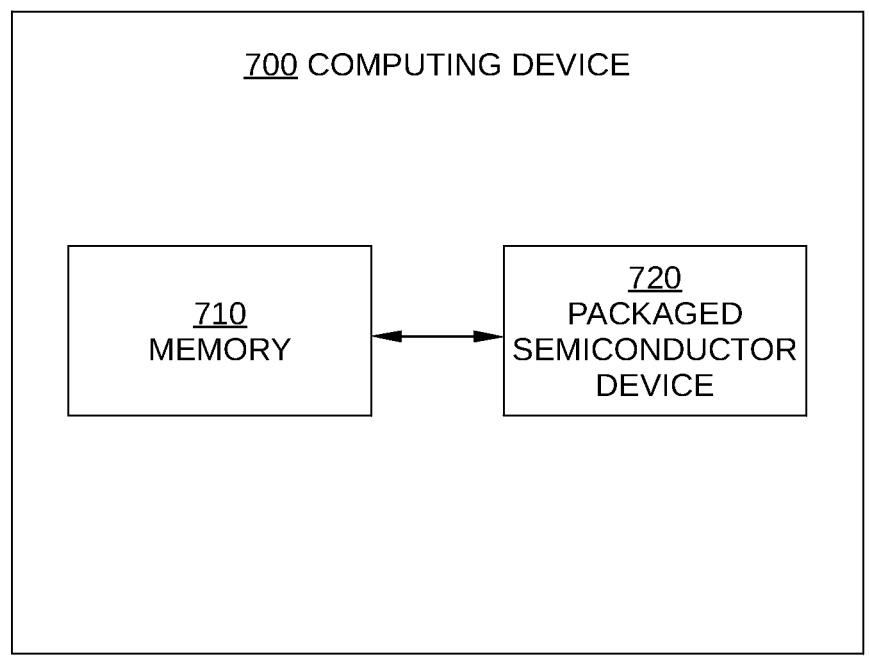
FIG. 7 illustrates a computing device in which one or more embodiments of the present invention can be implemented.

FIG. 7 illustrates a computing device in which one or more embodiments of the present invention can be implemented. Specifically, FIG. 7 is a block diagram of a computer system 700 with a packaged semiconductor device 720 configured according to an embodiment of the present invention. As shown, computer system 700 includes a memory 710 and a packaged semiconductor device 720 that is coupled to memory 710. Computer system 700 may be a desktop computer, a laptop computer, a smartphone, a digital tablet, a personal digital assistant, or other technically feasible computing device. Memory 710 may include volatile, non-volatile, and/or removable memory elements, such as random access memory (RAM), read-only memory (ROM), a magnetic or optical hard disk drive, a flash memory drive, and the like. Packaged semiconductor device 720 is substantially similar in organization and operation to microelectronic packages 100, 200, 300, 400, 500, or 600, described above in conjunction with FIGS. 1-6, and may include one or more of a CPU, a GPU, an application processor or other logic device, a system-on-chip (SoC), memory chips, or any other IC chip-containing device.

In sum, embodiments of the invention set forth a microelectronic package having a reduced package thickness. The microelectronic package includes an interposer that is formed from a semiconductor substrate and, in some embodiments, a mold compound that is connected to an edge surface of the interposer and is configured to stiffen the microelectronic package. An advantage of the above-described embodiment is that the thickness of a microelectronic package can be significantly reduced without the danger of unwanted warpage of components in the microelectronic package. A further advantage is that the use of mold compound in lieu of an underfill material to protect electrical connections between IC chips and the interposer reduces the overall footprint of the microelectronic package. This is owing to the elastic nature of mold compound, which allows passive components mounted to the interposer to be placed very close to IC chips that are also mounted on the interposer.

While the foregoing is directed to embodiments of the present invention, other and further embodiments of the invention may be devised without departing from the basic scope thereof, and the scope thereof is determined by the claims that follow.

I claim:

1. A microelectronic package, comprising:
   an interposer that is formed from a semiconductor substrate and includes a plurality of through-silicon vias;
   a semiconductor die coupled to a first surface of the interposer;
   a mold compound connected to an edge surface of the interposer and configured to stiffen the microelectronic package; and
   a packaging substrate coupled to a second surface of the interposer, wherein the first surface of the interposer is opposite to the second surface of the interposer.

2. The microelectronic package of claim 1, wherein the mold compound is formed between the semiconductor die and the first surface of the interposer.

3. The microelectronic package of claim 2, further comprising one or more passive devices that are coupled to the first surface of the interposer and disposed within about 1 mm of the semiconductor die.

4. The microelectronic package of claim 2, wherein the mold compound is formed via an injection molding process.

5. The microelectronic package of claim 1, further comprising a second semiconductor die coupled to the first surface of the interposer.

6. The microelectronic package of claim 5, wherein the mold compound is formed between the first semiconductor die and the second semiconductor die.

7. The microelectronic package of claim 1, further comprising a signal redistribution layer that is formed on the second surface of the interposer and is electrically coupled to the plurality of through-silicon vias.

8. The microelectronic package of claim 7, wherein a portion of the signal distribution layer is formed on the mold compound connected to the edge surface of the interposer.

9. The microelectronic package of claim 1, wherein the mold compound is connected to a surface of the packaging substrate.

10. The microelectronic package of claim 1, further comprising one or more semiconductor dies that are coupled to the packaging substrate.

11. The microelectronic package of claim 10, wherein the mold compound is connected to an edge surface of one of the one or more semiconductor dies coupled to the packaging substrate.

12. The microelectronic package of claim 10, wherein the mold compound is formed between at least one of the semiconductor dies coupled to the packaging substrate and the packaging substrate.

13. The microelectronic package of claim 12, further comprising one or more passive devices that are coupled to the substrate and disposed within about 1 mm of at least one of the semiconductor dies coupled to the packaging substrate.

* * * * *